(12) United States Patent
Matsumoto et al.

(10) Patent No.: US 7,129,937 B2
(45) Date of Patent: Oct. 31, 2006

(54) ACTIVE MATRIX TYPE DISPLAY DEVICE

(75) Inventors: Shoichiro Matsumoto, Ogaki (JP);
Mari Okubo, Mizuho (JP)

(73) Assignee: Sanyo Electric Co., Ltd., Osaka (JP)

( * ) Notice: Subject to any disclaimer, the term of this patent is extended or adjusted under 35 U.S.C. 154(b) by 216 days.

(21) Appl. No.: 10/952,365

(22) Filed: Sep. 29, 2004

(65) Prior Publication Data
US 2005/0110421 A1 May 26, 2005

(30) Foreign Application Priority Data
Sep. 30, 2003 (JP) ............... 2003-340649

(51) Int. Cl.
*G09G 5/00* (2006.01)
(52) U.S. Cl. ............ 345/204; 345/211; 345/212; 345/92; 345/90
(58) Field of Classification Search ............ None
See application file for complete search history.

(56) References Cited
U.S. PATENT DOCUMENTS
2002/0101394 A1* 8/2002 Anzai .................. 345/76
2002/0140644 A1* 10/2002 Sato et al. .............. 345/76
2005/0280618 A1* 12/2005 Sato et al. .............. 345/82

FOREIGN PATENT DOCUMENTS
JP 2003-108032 4/2003

* cited by examiner

*Primary Examiner*—Tuyet Thi Vo
(74) *Attorney, Agent, or Firm*—Morrison & Foerster LLP

(57) ABSTRACT

This invention provides an active matrix type display device where an aperture ratio of each of pixels is improved and a storage value of a storage capacitor is secured. A driving power supply line overlaps a storage capacitor line in each of the pixels to reduce an area formed with the driving power supply line. The storage capacitor line is disposed to wind in zigzag along a plurality of pixel selecting TFTs arrayed in a row, thereby effectively utilizing a pixel area. Furthermore, a longitudinal direction of a contact connecting a source of the pixel selecting TFT and a gate of a driving TFT is disposed parallel to the storage capacitor line.

8 Claims, 4 Drawing Sheets

ACTIVE MATRIX TYPE DISPLAY DEVICE

CROSS-REFERENCE OF THE INVENTION

This invention is based on Japanese Patent Application No. 2003-340649, the content of which is incorporated by reference in its entirety.

BACKGROUND OF THE INVENTION

1. Field of the Invention

This invention relates to an active matrix type display device, particularly, to a pixel layout of the display device.

2. Description of the Related Art

In recent years, organic electroluminescent (hereafter, referred to as EL) display devices using organic EL elements have been receiving attention as a display device substituting for a CRT or an LCD. Particularly, active matrix type organic EL display devices having thin film transistors (hereafter, referred to as TFTs) as switching elements for driving the organic EL elements have been developed.

A color display has been already utilized in the active matrix type organic EL display device used as a flat panel display. In such a color organic EL display device, a plurality of pixels disposed in a matrix on a glass substrate is applied to any one of colors of R (red), G (green), and B (blue).

For realizing the active matrix type color organic EL display device, a stripe array where pixels of same color are arrayed in a column direction like stripes and a delta array where pixels of same color are arrayed, being shifted by a predetermined pitch in each of rows relative to a column direction have been known. The delta array is suitable for a pixel layout of the color organic EL display device since a high-resolution image can be displayed.

Such an active matrix type color organic EL display device using the delta array is disclosed in Japanese Patent Application Publication No. 2003-108032.

SUMMARY OF THE INVENTION

This invention provides a pixel layout of an active matrix type color organic EL display device using a delta array, wherein an aperture of each of pixels is improved and a storage value of a storage capacitor is secured.

The invention provides an active matrix type display device that includes a plurality of pixels arranged as a matrix, a pixel selecting line supplying a pixel selecting signal to the pixels, a data line supplying display data to the pixels, a driving power supply line supplying power to the pixels, a pixel selecting transistor provided in each of the pixels and passing the display data to the pixels in response to the pixel selecting signal, and a storage capacitor provided in each of the pixels and storing the display data. The storage capacitor includes a storage capacitor line, an electrode in contact with a source of the pixel selecting transistor and a capacitor insulating film disposed between the electrode and the storage capacitor line. The display device also includes a display element provided in each of the pixels, and a driving transistor provided in each of the pixels and supplying a current or a voltage from the driving power supply line to the display element according to the display data stored in the storage capacitor. The driving power supply line bends from a longitudinal direction thereof so as to cover part of the storage capacitor line.

DETAILED DESCRIPTION OF THE INVENTION

Figure 1:
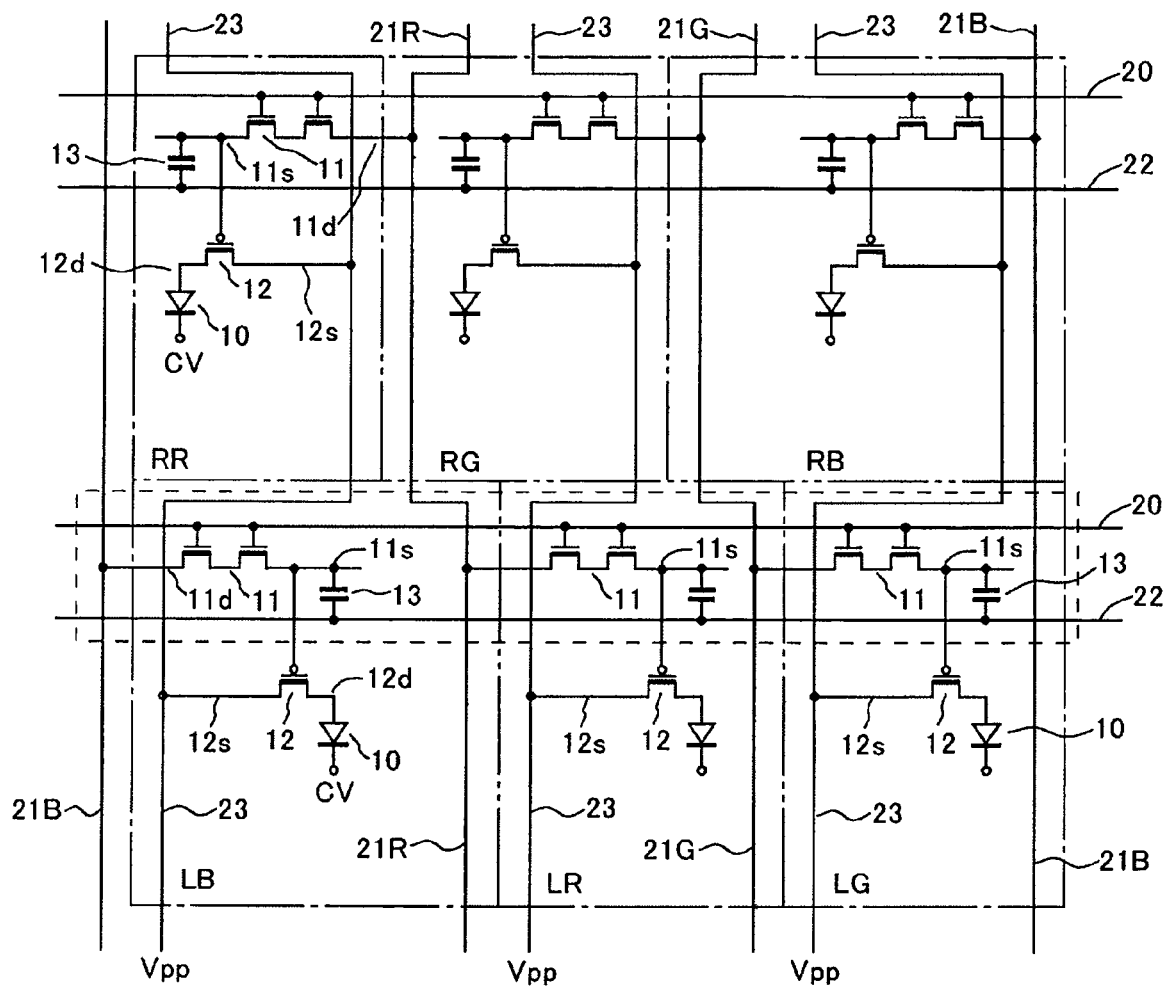
FIG. 1 shows a pixel layout of an active matrix type color organic EL display device of an embodiment of the invention.

An embodiment of the invention will be described. FIG. 1 shows a pixel layout of an active matrix type color organic EL display device of this embodiment. Although FIG. 1 shows a pixel array of two rows and three columns only, a plurality of pixels is arrayed in row and column directions to form a pixel region in a matrix of n rows and m columns in an actual active matrix type color organic EL display device.

In FIG. 1, one pixel corresponds to a region encircled by the unevenly broken line. In the first row, the pixels respectively corresponding to R (red), G (green) and B (blue) are arrayed. In the second row, the pixels respectively corresponding to R, G and B are arrayed, being shifted by a predetermined pitch (1.5 pixel in FIG. 1), thereby forming a delta array. Pitches of the pixels respectively corresponding to R, G and B are different from each other.

Each of the pixels has an organic EL element 10, a pixel selecting TFT (thin film transistor) 11, a driving TFT 12 for driving the organic EL element 10, and a storage capacitor 13.

The pixel selecting TFT 11 is a N-channel type, for example. A gate of the pixel selecting TFT 11, which has a double gate structure, is connected with a gate line 20 serving as a pixel selecting line, and a source 11s thereof is connected with the storage capacitor 13. Furthermore, a drain 11d of the pixel selecting TFT 11 is connected with a data line 21R to be supplied with R display data in a case of the pixel corresponding to R, a data line 21G to be supplied with G display data in a case of the pixel corresponding to G, or a data line 21B to be supplied with B display data in a case of the pixel corresponding to B.

The storage capacitor 13 includes a first electrode integrally formed with the source 11s of the pixel selecting TFT 11 and a storage capacitor line 22 formed above the first electrode facing thereto with a capacitor insulating film interposed therebetween.

The source 11s of the pixel selecting TFT 11 is connected with a gate of the driving TFT 12, which is, for example, a P-channel type. A source 12s of the driving TFT 12 is connected with a driving power supply line 23 supplied with a positive driving voltage Vpp, and a drain 12d thereof is connected with an anode of the organic EL element 10. A cathode of the organic EL element 10 is supplied with a negative voltage CV. An organic EL emissive layer is formed between the anode and the cathode.

In the active matrix type color organic EL display device, an emissive region of each of the pixels is mainly determined by the region of the anode formed in each of the pixels. The remaining pixel selecting TFT 11, the driving TFT 12, and the storage capacitor 13 make no contribution to light emission. Therefore, for increasing the emissive area in a pixel area, that is, an increase in the aperture, it is necessary to minimize the area formed with the pixel selecting TFT 11 and so on.

As explained below, this embodiment employs a pixel layout as follows: (1) the driving power supply line 23 overlaps the storage capacitor line 22 in each of the pixels to reduce the area formed with the driving power supply line 23; (2) the storage capacitor line 22 is disposed winding in zigzag along the plurality of the pixel selecting TFTs 11 arrayed in a row direction to effectively use a pixel area; (3) a contact connecting the source 11s of the pixel selecting TFT 11 and the gate 12g of the driving TFT 12 is disposed so that a longitudinal direction of the contact is parallel to the storage capacitor line 22.

Figure 2A:
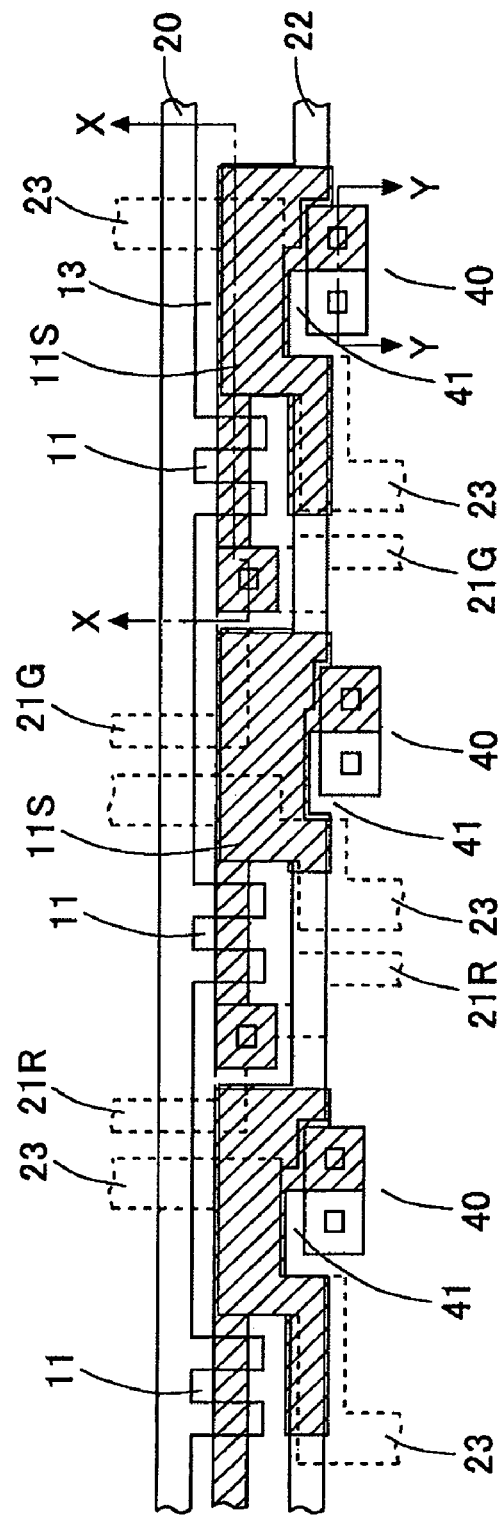
FIGS. 2A and 2B shows plan pattern corresponding to the region encircled by the broken line in FIG. 1.
Figure 2B:
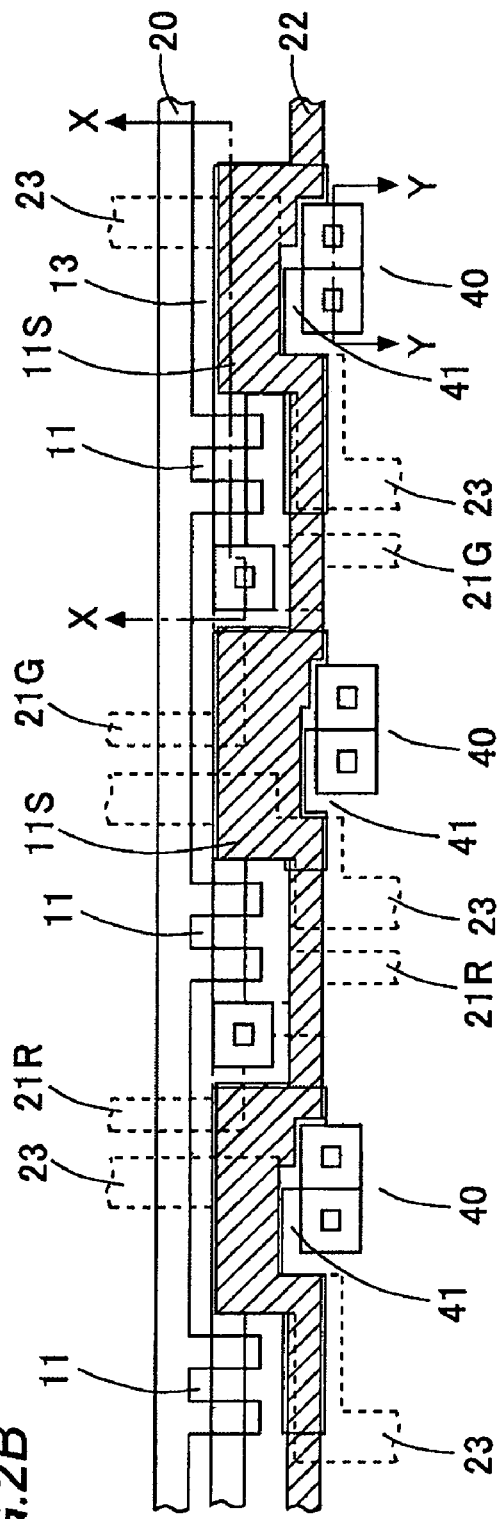

A detail description will be made with reference to FIGS. 1, 2A, 2B and 3. FIGS. 2A and 2B are plan pattern views corresponding to the encircled by the broken line in FIG. 1. To promote understanding, an active layer region formed with the source 11s and the drain 11d of the pixel selecting TFT 11 is shown by a shaded area in FIG. 2A, the storage capacitor line 22a is shown by a shaded area in FIG. 2B, and the driving power supply line 23 is shown by a shaded area in FIG. 3.

Figure 3:
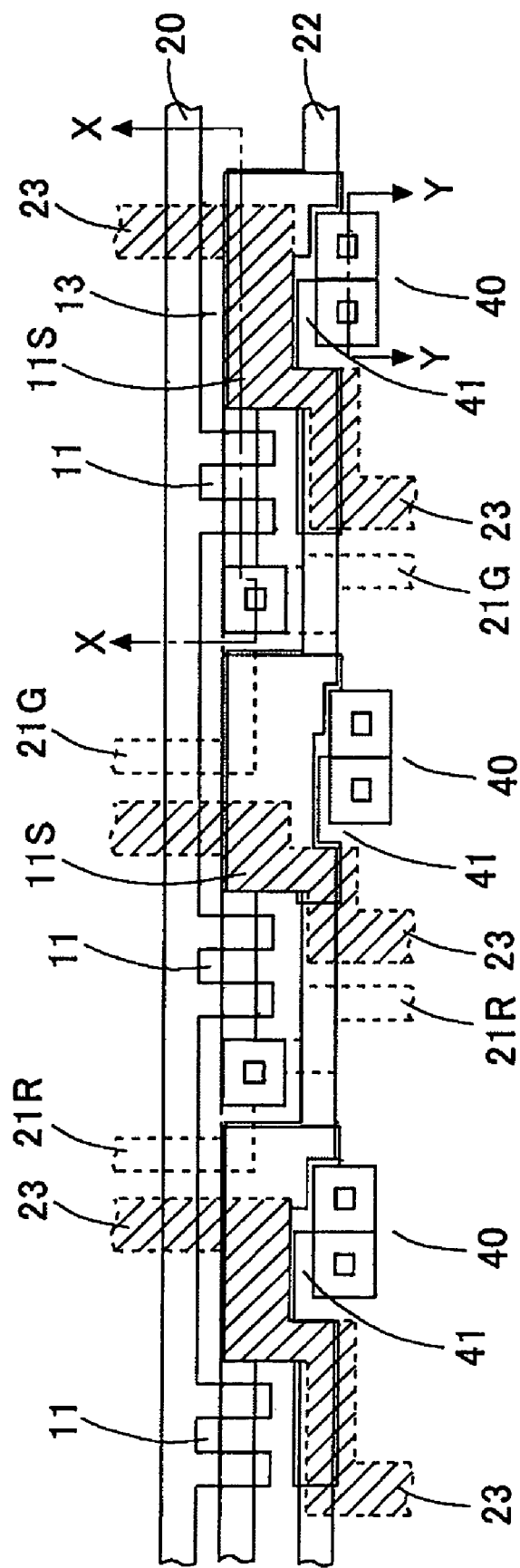
FIG. 3 shows a plan pattern corresponding to the region encircled by the broken line in FIG. 1.

A description will be made on (1) described above. In FIG. 1, with reference to pixels RB and LG placed adjacent to each other in a column direction, the driving power supply line 23 extends vertically along the left side of the pixel LG and is connected with the source 12s of the driving TFT 12 in the middle thereof. Furthermore, the driving power supply line 23 bends and extends horizontally along the top side of the pixel LG, and then extends vertically along the right side of the pixel RB. As shown in FIGS. 2A–3, in the portion where the driving power supply line 23 extends horizontally, the driving power supply line 23 extends, overlapping the storage capacitor line 22.

Next, a description will be made on (2). The storage capacitor line 22 winds in zigzag along the three pixel selecting TFTs 11 as shown in FIGS. 2A and 2B. That is, the storage capacitor line 22 bends so as to become close to the gate line 20 between a pair of double gates of the adjacent pixel selecting TFTs 11, then bends so as to pass tips of the double gates, and bends so as to become close to the gate line 20 between next pair of double gates. The source 11s of the pixel selecting TFT 11 is formed under the storage capacitor line 22 facing thereto, the storage capacitor 13 is formed in this facing portion, so that a small area is effectively utilized to secure an appropriate storage value.

The storage value of the storage capacitor 13 is determined by the area of the portion where the source 11s of the pixel selecting TFT 11 and the storage capacitor line 22 overlap each other. In this embodiment, the shape of the overlapping portion differs among the pixels corresponding to R, G and B, but the area of the overlapping portion is equal among themselves.

Next, description will be made on (3). The storage capacitor line 22 is disposed winding in zigzag, so that concave portions and convex portions are formed in the storage capacitor line 22 as shown in FIG. 2B. A contact 40 connecting the source 11s of the pixel selecting TFT 11 and the gate 12g of the driving TFT 12 is disposed so that the longitudinal direction of the contact 40 is parallel to the storage capacitor line 22 and a part of the contact 40 is placed inside the concave portion 41 of the storage capacitor line 22. This can save an area in a vertical direction in each of the pixels and increase the emissive region, thereby improving the aperture.

Figure 4A:
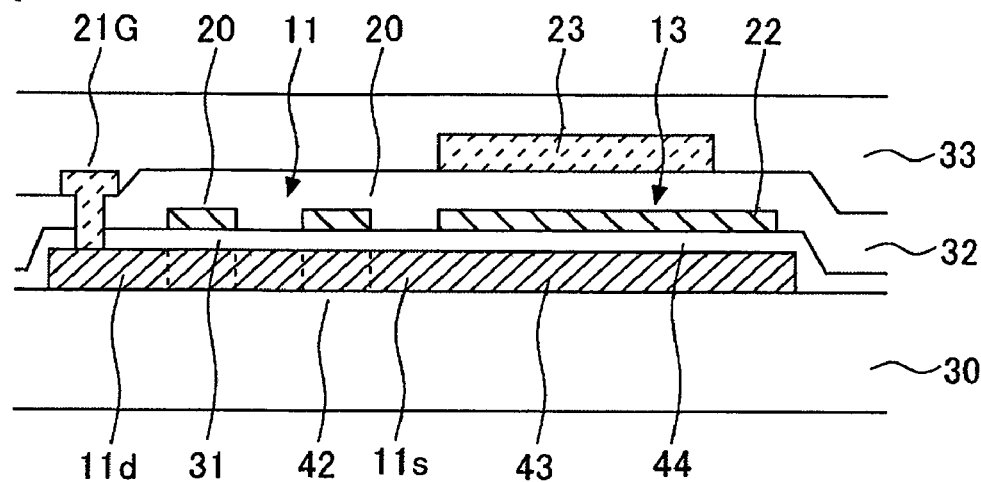
FIG. 4A is a cross-sectional view of FIGS. 2A and 2B along line X—X.

Next, description will be made on the manner the driving power supply line 23 overlaps the storage capacitor line 22 and the structure of the contact 40 in more detail with reference to FIGS. 4A and 4B. FIG. 4A is a cross-sectional view of FIGS. 2A and 2B along line X—X, and FIG. 4B is a cross-sectional view of FIGS. 2A and 2B along line Y—Y.

As shown in FIG. 4A, an active layer 42 is formed on an insulating substrate 30 such as a glass substrate. The active layer 42 is formed of polysilicon which is formed by poly-crystallizing a-Si (amorphous silicon) by laser annealing. A first electrode 43 of the storage capacitor 13, which is integrally formed with the source 11s, the drain 11d, and the source 11s of the pixel selecting TFT 11, is formed in the active layer 42. A gate insulating film 31, and a capacitor insulating film 44 which is integrally and simultaneously formed with the gate insulating film 31 are formed on the active layer 42.

The gate line 20 serving as the gate of the pixel selecting TFT 11 is formed on the gate insulating film 31, the storage capacitor line 22 serving as a second electrode is formed on the capacitor insulating film 44. The gate line 20 is formed of, for example, a chromium layer. An interlayer insulating film 32 is formed on the gate line 20 and the storage capacitor line 22. The driving power supply line 23 extends along the storage capacitor line 22 with the interlayer insulating film 32 interposed therebetween. A planarizing insulating film 33 is formed on the driving power supply line 23.

Figure 4B:
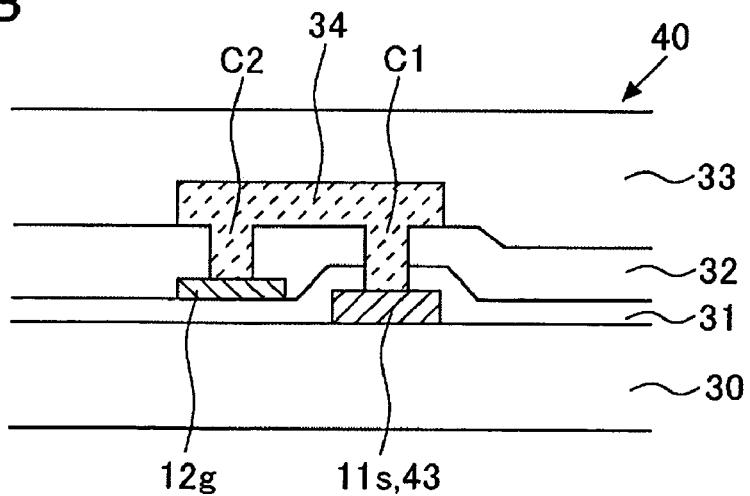
FIG. 4B is a cross-sectional view of FIGS. 2A and 2B along line Y—Y.

FIG. 4B shows the structure of the contact 40. An extended portion of the source 11s of the pixel selecting TFT 11 is formed on the insulating substrate 30, and connected with an Al layer 34 through a first contact hole C1 formed in the gate insulating film 31 and the interlayer insulating film 32. A gate 12g of the driving TFT 12 is disposed in a position close to the source 11s, and connected with the Al layer 34 through a second contact hole C2 formed in the interlayer insulating film 32.

Accordingly, in the pixel layout of this embodiment, the area except the emissive region in the organic EL element 10 is increased so that the aperture of each of the pixels corresponding to R, G and B is increased. It is noted that the pixels corresponding to R, G and B may have different aperture even if the pixels correspond to the same color. For example, both the pixel RB and pixel LB in FIG. 1 are blue pixels, but the aperture thereof differ from each other.

Although this embodiment is described by employing the active matrix type color organic EL display device as an example, this invention can be widely applied to a general active matrix type display device having pixel selecting TFTs and storage capacitors, which is commonly known, i.e., an active matrix type LCD display device and so on. In other words, the organic EL display element 10 may be replaced by other display element such as a liquid crystal display element.

What is claimed is:

1. An active matrix type display device comprising:
 a plurality of pixels arranged as a matrix;
 a pixel selecting line supplying a pixel selecting signal to the pixels;
 a data line supplying display data to the pixels;
 a driving power supply line supplying power to the pixels;
 a pixel selecting transistor provided in each of the pixels and passing the display data to the pixels in response to the pixel selecting signal;
 a storage capacitor provided in each of the pixels and storing the display data, the storage capacitor comprising a storage capacitor line, an electrode in contact with a source of the pixel selecting transistor and a capacitor insulating film disposed between the electrode and the storage capacitor line;

a display element provided in each of the pixels; and a driving transistor provided in each of the pixels and supplying a current or a voltage from the driving power supply line to the display element according to the display data stored in the storage capacitor, wherein the driving power supply line bends from a longitudinal direction thereof so as to cover part of the storage capacitor line.

2. The active matrix type display device of claim 1, further comprising a contact connecting the source of the pixel selecting transistor and a gate of the driving transistor, wherein the contact comprises a first contact connecting the source of the pixel selecting transistor and a metal layer and a second contact connecting the metal layer and the gate of the driving transistor, and the first and second contacts are arranged parallel to a longitudinal direction of the storage capacitor line.

3. The active matrix type display device of claim 1, wherein the storage capacitor line is disposed along the pixel selecting line so that pat of the storage capacitor line is bent to fill space between two neighboring pixel selecting transistors.

4. The active matrix type display device of claim 3, further comprising a contact connecting the source of the pixel selecting transistor and a gate of the driving transistor, wherein the contact comprises a first contact connecting the source of the pixel selecting transistor and a metal layer and a second contact connecting the metal layer and the gate of the driving transistor, and the first and second contacts are arranged parallel to a longitudinal direction of the storage capacitor line.

5. The active matrix type display device of claim 1, wherein each of the pixels corresponds to red, green or blue pixel, and shapes of the storage capacitors of the red, green and blue pixels are different from each other.

6. The active matrix type display device of claim 5, wherein the storage capacitors of the red, green and blue pixels have an identical capacitance.

7. The active matrix type display device of claim 1, wherein the red, green and blue pixels are arranged with respective and different pitches.

8. The active matrix type display device of claim 7, wherein an aperture of a pixel corresponding to one color is different from an aperture of another pixel corresponding to said one color.

* * * * *